United States Patent [19]

Schouhamer Immink et al.

[11] Patent Number: 4,477,903
[45] Date of Patent: Oct. 16, 1984

[54] ERROR CORRECTION METHOD FOR THE TRANSFER OF BLOCKS OF DATA BITS, A DEVICE FOR PREFORMING SUCH A METHOD, A DECODER FOR USE WITH SUCH A METHOD, AND A DEVICE COMPRISING SUCH A DECODER

[75] Inventors: Kornelis A. Schouhamer Immink; Lodewijk B. Vries, both of Eindhoven, Netherlands

[73] Assignee: U.S. Philips Corporation, New York, N.Y.

[21] Appl. No.: 393,940

[22] Filed: Jun. 30, 1982

[30] Foreign Application Priority Data

Jan. 21, 1982 [NL] Netherlands ............... 8200207

[51] Int. Cl.³ .................................. G06F 11/10
[52] U.S. Cl. ................................ 371/37; 371/38
[58] Field of Search ................. 371/40, 38, 39

[56] References Cited

U.S. PATENT DOCUMENTS

| | | | |
|---|---|---|---|
| 4,238,852 | 12/1980 | Iga et al. | 371/40 |
| 4,281,355 | 7/1981 | Wada et al. | 371/40 |
| 4,306,305 | 12/1981 | Doi et al. | 371/38 |
| 4,356,564 | 10/1982 | Doi et al. | 371/40 |

Primary Examiner—Charles E. Atkinson
Attorney, Agent, or Firm—Jack E. Haken; James J. Cannon, Jr.

[57] ABSTRACT

For an error correction method for the transfer of word-wise arranged data, two word correction codes are successively used, each code acting on a group of words while therebetween an interleaving step is performed. The actual transfer takes place by means of channel words for which purpose there are provided a modulator and a demodulator. Invalid channel words are provided with an invalidity bit in the demodulator. During the (possibly correcting) reproduction of the data words, the invalidity bits can be used in one of the two error corrections in various ways. When too many words of a group of code words are invalid, all words of the relevant group are invalidated. If a word comprising an invalidity bit is not corrected during correction by means of a syndrome variable, all words of the relevant group are invalidated. If the number of invalidity bits lies within given limits, they act as error locators so that the code is capable of correcting a larger number of words.

16 Claims, 5 Drawing Figures

$$[H] = \begin{pmatrix} 1 & 1 & 1 & \cdots & 1 & 1 \\ a^1 & a^{1.2} & a^{1.3} & \cdots & a^{n-1} & a^n \\ a^2 & a^{2.2} & a^{2.3} & \cdots & a^{2(n-1)} & a^{2.n} \\ a^3 & a^{3.2} & a^{3.3} & \cdots & a^{3(n-1)} & a^{3.n} \\ \vdots & \vdots & \vdots & & & \\ a^{(k-1)} & a^{(k-1)2} & a^{(k-1)3} & \cdots & a^{(k-1)(n-1)} & a^{(k-1)n} \end{pmatrix}$$

ERROR CORRECTION METHOD FOR THE TRANSFER OF BLOCKS OF DATA BITS, A DEVICE FOR PREFORMING SUCH A METHOD, A DECODER FOR USE WITH SUCH A METHOD, AND A DEVICE COMPRISING SUCH A DECODER

BACKGROUND OF THE INVENTION

1. Field of the Invention

The invention relates to an error correction method for the transfer of word-wise arranged data, comprising the following steps:

a. receiving a first number of data words in a first error encoder in order to add thereto a first series of parity words on the basis of a first generator matrix of a first word correction code;

b. delaying said first numbers of data words and first series of parity word by delay times which are all different within each first number and associated first series in order to interleave said words so as to form as many second numbers of words;

c. receiving a second number of words in a second error encoder in order to add thereto a second series of parity words on the basis of a second generator matrix of a second word correction code so as to form a third number of words;

d. word-by-word modulation of said serially linked third numbers of words in order to form channel words which satisfy, by way of added redundancy, predetermined upper limits and lower limits for the admissible intervals between directly successive signal transitions, said channel words being serially concatenated and pair-wise separated by merging bits which also satisfy said upper limits and lower limits in conjunction therewith;

e. demodulation of the channel words and merging bits after the transfer in order to reconstruct said third number of words;

f. reproducing and, if possible and necessary, correcting said second numbers of words on the basis of the second parity check matrix associated with the second generator matrix;

g. de-interleaving said second numbers of words, followed by the reproducing and, if possible and necessary, correcting of said first numbers of data words for a user on the basis of the first parity check matrix associated with the first generator matrix.

2. Description of the Prior Art

Part of the transfer with error correction described above has already been disclosed in Netherlands Patent Application No. 8102441 assigned to the assignee of this application which is based on a Japanese Application No. 567608-80 in the name of Sony Corporation, Shinagawa-ku, Tokyo, Japan. The corresponding U.S. patent applications are Ser. No. 265,465, filed May 20, 1981 and Ser. No. 320,492 filed Nov. 12, 1981, both assigned to Sony, now U.S. Pat. No. 4,413,340. U.S. Pat. No. 4,413,340 is incorporated herein by way of reference. Within a second number of words or a third number of words, a limited number of words can thus be corrected or a further limited number of words can be detected as being incorrect, said limited numbers being given by the minimum Hamming distance of the code taken over the symbols. This will be described in detail hereinafter. If the number of incorrect words within a second or third number of words is larger than the relevant admissible value, the error correction or the detection of incorrect words fails. When the error correction fails, either incorrect words are not corrected or words are incorrectly corrected, or both. If the error detection fails, either correct words are indicated as being incorrect or incorrect words are not indicated as being incorrect, or both. Furthermore the modulation and demodulation has been described in another Netherlands Patent Application No. 8004028, in the name of Applicant. The U.S. Ser. No. is 286,982, filed July 27, 1981, assigned to Sony. This is also incorporated herein by way of reference.

SUMMARY OF THE INVENTION

It is an object of the invention to combine error correction mechanisms and the further redundancy in the data transferred which is introduced therein by the described modulation so that use can be made of channel words which are found to be incorrect after the modulation as indicators for a generally unreliable second number of words. A first version of the method in accordance with the invention utilizes this principle and is characterized in that during the demodulation a first flag bit is added to the word of said third number of words which is formed from an irrecognizable channel word, a second flag bit being added to each word of the relevant second number of words during the reproduction of a said second number of words on the basis of the second parity check matrix, under the control of an excessive number of first flag bits within a said third number, in order to indicate the relevant second number of words as being generally unreliable.

The invention is based on the recognition of the fact that during the transfer (via a broadcast channel, a communication link or a storage medium such as an optical storage disc or a magnetic tape) usually trains of disturbed channel words or burst errors occur which can impart an arbitrary content to a channel word. In that case it is not impossible for a correct channel word to occur again. The invention is also based on the recognition of the fact that it is attractive to detect the error as soon as possible, that is to say before application to the first error correction decoder. The redundancy introduced during modulation allows for such a detection. In the described case a limited number of words could be corrected. If more words are indicated as being incorrect, the correction is omitted in order to be performed, for example, only after de-interleaving. Thanks to the de-interleaving, a number of words which are indicated as being unreliable are spaced further apart, so that the local concentration of incorrect words is reduced in many cases. A further aspect of the foregoing is that the indication of incorrect channel words allows for correction of a larger number of words: said system, for example, is capable of correcting four words localized as being incorrect. For safety reasons correction may still be undertaken in the case of three channel words indicated as being incorrect, but in the case of four incorrect channel words (which themselves are correctable), the second number of words is preferably indicated as being unreliable.

A second version of the method in accordance with the invention is characterized in that during the demodulation a first flag bit is added to the word of said third number of words which is formed from an irrecognizable channel word, during the reproduction of a said second number of words on the basis of the second parity check matrix, under the control of the absence of a correction to be made in a word and a first flag bit indicating exactly that word, a second flag bit being added to each word of the relevant second number of words in order to indicate said second number of words as being generally unreliable. On the one hand, the number of words which can be corrected by means of the second error correction code is not increased; in accordance with the state of the art, this number equals two. On the other hand, however, the safety margin is increased: if a word without a first flag bit is to be corrected, very likely neighboring words also have to be corrected, but these words are not provided with a first flag bit because the associated channel words did satisfy the modulation rules. The possibility of effective detection of incorrect words is thus enhanced.

Preferably, during the reproduction of a said first number of data words on the basis of the first parity check matrix under the control of an excessive further number of second flag bits within said second number a third flag bit is added to the relevant first number of data words in order to indicate said first number of data words as being generally unreliable. Thus, for the sake of precaution, a number of data words can be indicated as being generally unreliable, also at the level of the first parity check matrix. For example, if the data transferred concerns digitized acoustic signals, an irrecognizable data word can be concealed in that the relevant acoustic signal sample is replaced by the directly preceding signal sample which is based on correct data words. This is referred to as "zero-order" interpolation".

In the case of a systematic first error correction code, during the reproduction of a said first number of data words on the basis of the first parity check matrix under the control of the absence of a correction to be made in a word and a second flag bit which indicates exactly that word preferably a third flag bit is added to each word of the relevant first number of data words in order to indicate said first number of data words as being generally unreliable. A step of the described kind can then also be taken at the level of the first error correction code. The term "systematic" is to be understood to concern herein the word level, so that in the correct condition of the code words each data word requires only one code word in order to be reproduced.

Preferably, during the reproduction of a said first number of data words on the basis of the first parity check matrix use is made of a number of second flag bits which lies between predetermined limits in order to act as error locators for a correction to be performed. A second flag bit is thus attractively used to enhance the possibility of correction by the first error correction code.

The invention also relates to a device for performing the described method, in which the first numbers of data words are formed by a sound pick-up system with analog-to-digital converter, the number of merging bits amounting to three and said upper limit and lower limit being 11 (eleven) and 3 (three) channel bits, respectively. It has been found that this is an attractive choice.

The invention also relates to a device for the decoding and demodulation of data transferred by means of the method, a non-correctable first number of data words then being replaced by substitute data. Such a concealment of an incorrect word has an adverse effect on the audio quality, but is far less detrimental than the risk of a clicking noise which is experienced as being very annoying by a listener.

The invention also relates to a decoder for use in a device of the described kind in which a group of synchronizing channel bits is ignored during the demodulation and a further group of control bits is ignored for the (possibly correcting) reproduction after demodulation. The synchronization can thus be readily implemented.

BRIEF DESCRIPTION OF THE FIGURES

The invention will be described in detail hereinafter with reference to some Figures.

DESCRIPTION OF THE PREFERRED EMBODIMENT

Figure 1:
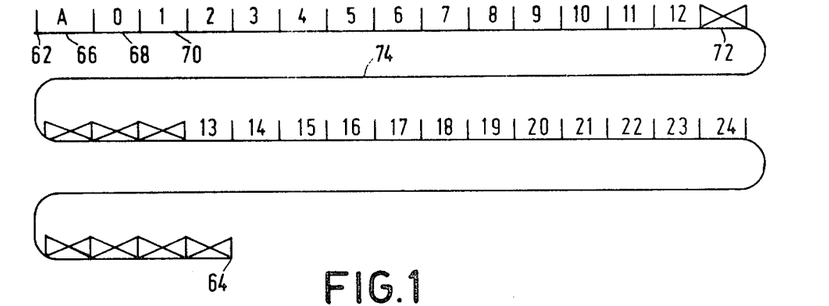
FIG. 1 shows a diagram of a preferred configuration of the channel words.

FIG. 1 shows a preferred configuration in which the channel words are presented; the channel words are organized in blocks, one of which is shown. After the beginning at the indication 62, first a synchronization word A(66) is presented and subsequently a control word "0" (68). The further channel words are formed by means of systematic error correction codes, so that there are 24 non-redundant channel words (1–24), as indicated by the indication 70, and eight parity channel words which are indicated by a cross, for example, the channel word 72. The block terminates at the indication 64. The meandered line 74 indicates the time sequence. Actually, all channel words indicated directly succeed one another, be it that they are followed each time by three merging bits. With the exception of the synchronization word 66, each channel word consists of fourteen channel bits. The number of channel bits of the same value in direct succession is not smaller than three and not larger than eleven. It has been found that this results in 267 feasible combinations, 256 of which are used to represent an 8-bit code word, the remaining eleven either not being used or being used for special purposes. The merging bits within the chain of channel words also satisfy the upper limits and lower limits imposed as regards the number of directly successive channel bits having mutually the same binary values.

Figure 2:
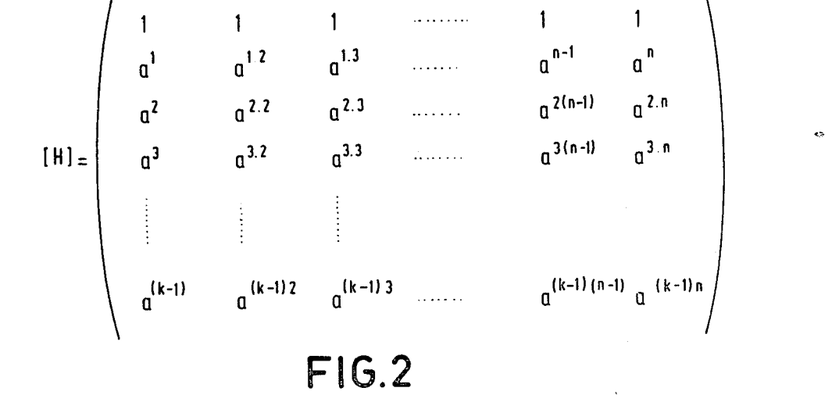
FIG. 2 shows a preferred embodiment of a parity check matrix (H)

FIG. 2 shows a parity check matrix (H) of a word correction code to be used. The generator matrix (G) of this code is given in that the matrix product $(G) \cdot (H) = 0$. The number of columns of the matrix (H) equals the number of code words to be processed together. The number of rows of the matrix (H) equals the number of redundancy words included in the code words. It has previously been proposed to supplement a number of 24 data words in a first error correction code with four redundancy words in order to obtain 28 words. Subsequently, these 28 words are interleaved in order to form as many second numbers of words (also 28). Finally, four further redundancy words are added to said second numbers of words in a second error correction code in order to form a third number of words which are modulated in order to form as many channel words. For the first error correction code, the number of columns of the parity check matrix then equals 28; for the second error correction code, said number of columns equals 32. In both cases the number of rows of the matrix (H) equals four. The elements $a^\circ = 1, a^1 \ldots$ of the matrix (H)

are elements of a Galois field GF ($2^m$) which are generated by the associated primitive and irreducible generator polynomial. The number of bits of the relevant words is m, for which $n \leq 2^m - 1$; in the present embodiment, $m = 8$. By addition of four redundant code words, a minimum Hamming distance over the code words of five can be realized. Two incorrect code words can thus be corrected, without it being necessary to know which code words are incorrect. The redundancy offered by the four redundant words is then sufficient to represent the error vector (the error pattern) as well as the error locator for both words. When the error locator is known, knowing the error vector alone may be sufficient for correction of said incorrect word. When four words are incorrect whose error locator has been obtained in a different manner, a number of four redundant words suffices for the correction. If the error locator of two words is known, four redundant words are sufficient for correction of the relevant two words and also for localizing and correcting an incorrect word whose location need not be known. The same code is also capable of detecting four incorrect words. The sum of the number of incorrect words to be detected plus the sum of the number of incorrect words to be corrected whose location has become known in a different manner, therefore equals four. For other codes built up in accordance with the described restrictions and involving different numbers of redundant words, corresponding numbers of detectable/correctable incorrect words are applicable.

Figure 3:
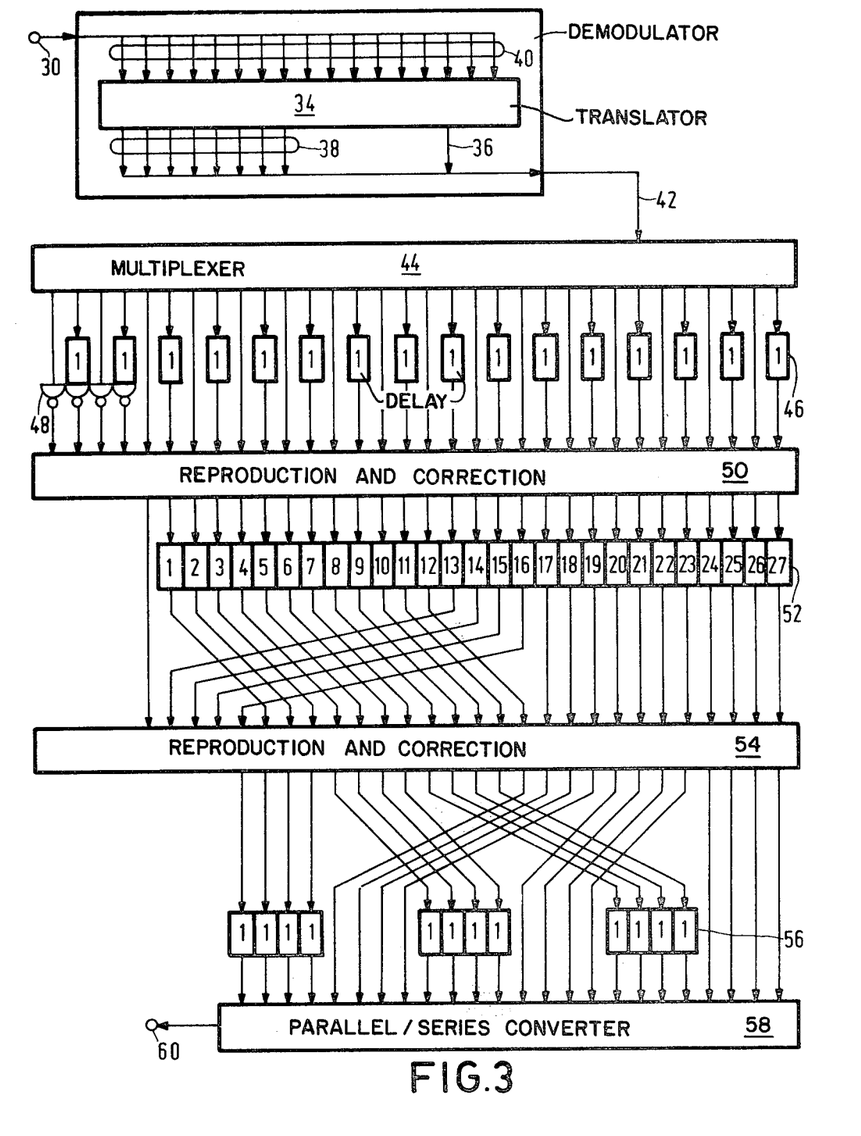
FIG. 3 shows a block diagram of a decoder for use in accordance with the invention.

FIG. 3 shows a decoder for use with the invention. It is to be noted that the invention can be used in an encoder as described in said U.S. patent application No. 4,413,340 which, therefore, will not be elaborated herein. In the set-up shown in FIG. 3, the information of the channel words arrives on the input 30 in a bit serial manner. In the demodulator 32, first a series/parallel conversion takes place, so that a complete code word becomes available on the fourteen-fold connection 40. The actual series/parallel converter and the clock system required have been omitted for the sake of simplicity. Block 34 represents a translator which converts a correctly received fourteen-bit channel word into the corresponding 8-bit code word on the 8-fold connection 38 plus a binary "zero" on the single connection 36. Several possibilities exist when the channel word is not correct: first of all, an arbitrary word may be produced on the connection 38, for example, "00000000" and a logic "1" on the connection 36. Alternatively, the incorrect channel word is translated into a correct channel word which corresponds as well as possible thereto and which is translated into the corresponding code word (obviously, this can be performed in one operation). Usually, a single-bit error in a channel word can be repaired; in cases where several code words can be formed with the same probability (the same Hamming distance between incorrect channel word and several correct channel words), one of these correction code words is chosen as a substitute in accordance with the foregoing. Multibit errors generally cannot be suitably corrected. The translation of a correct channel word into the corresponding 8-bit demodulated word is subsequently performed; this translation may also be implicit, so that the demodulation is performed in a single stroke. Each time when a channel word received is detected as being incorrect, the connection 36 carries a logic flag bit "1". It is alternatively possible to construct the line 36 to be multiple in order to indicate whether a channel word received was correct, or whether unambiguous correction was possible, or whether a substitute word has been chosen from several substitutes. In many cases an error is accompanied by further errors in neighboring code bits; the phenomenon is referrd to as a burst error. Bit-wise correction of the code bits is then often impossible, and the bit on the connection 36 has the significance valid/invalid. A "valid" code word, therefore, may very well be incorrect. In that case a 8-bit demodulated word appears serially or in parallel on the output 42 of the demodulator 32 in conjunction with at least one flag bit or validity bit. The block 34 may be constructed as a read-only memory with an address having a width of 14 bits and an output data path having a width of 9 bits (or possibly more bits). The merging bits are ignored for the conversion into code bits. If desirable, the merging bits may be taken into account for the formation of the valid/invalid bit, because they must also satisfy the modulation restriction. The merging bits may then be considered as forming part of the directly preceding channel word. The control word (68 in FIG. 1) is also presented to the input 30 as a 14-bit channel word (with merging bits), so that it can also be provided, if desirable, with a valid/invalid bit. The synchronization word 66 and also the control word 68, however, are ignored for the error correction. A branch of the connection 38 for this purpose, however, has been omitted in the Figure.

The remainder of the decoder is mainly known from said state of the art. Block 44 represents a multiplexer which comprises one input 42 and 32 parallel outputs. Multiplexing is performed word-wise, so that each output receives one complete word, including the associated validity bit (bits). Blocks which are indicated by the numeral "1", for example, the block 46, delays the words applied thereto by a time interval which corresponds to the period during which exactly 32 words, including the associated validity bit (bits), arrive on the connection 42. Elements such as the element 48 are invertors whereby the parity words of the second error correction code are inverted. Element 50 is the reproduction and correction element for the second error correction code for implementing the parity check matrix (with $n = 32$) which is shown in FIG. 2. Without using the validity bits, two incorrectly received words can be corrected. The processing of the data within the element 50 will be described with reference to a flow chart. Thus, for each of the 32 words received from the element 44, each time 28 8-bit output words arrive on the output of the reproduction and correction element 50, each output word being accompanied by its own validity bit. A logic "0" indicates that the relevant word is reliable; a logic "1" indicates that the relevant word is unreliable. In given cases (see hereinafter), the entire group of 28 words is indicated as being generally unreliable, because all 28 words have a validity bit of the value "1". The data rate on the output (outputs) of the element 50, therefore, amounts to $28/32 = \frac{7}{8} \times$ the word rate on the corresponding input (inputs) of the element 50. The blocks 52 which are denoted by the reference numerals 1 to 27 delay the words received in order to introduce a de-interleaving effect. A "1" in a block indicates a delay which corresponds to the period of time required for the output of exactly one group of 28 words by the element 50. An indication "14" indicates a period of time which corresponds to the output of fourteen of such successive groups. Each of a group of 28 words output together by the element 50 is thus assigned to a relevant newly formed group of 28 words. The effect of a burst error is thus spread over a large time interval, so that it is ensured that generally each newly formed group of 28 words contains at the most a small number of incorrect words.

Element 54 is the reproduction and correction element for the first error correction code for implementing the parity check matrix (with n=28) which also corresponds to FIG. 2. Without using the validity bits, a number of K/2 (when K is even; in this case K=4) of incorrect words received can be corrected. The data processing mechanism in the element 54 will be described hereinafter with reference to a flow chart. Thus, on the output of the reproduction and correction element 54, 28 8-bit data words appear for each group of 28 (interleaved) input words, said data words being accompanied or not by a validity bit having the previously described significance. In some cases (see hereinafter) the entire group of 24 words is indicated as being generally unreliable, because all 24 words comprise a relevant validity bit having the value "1". The data rate on the output of the element 54, therefore, amounts to $24/32 = \frac{3}{4} \times$ the word rate on the input of the element 50. Blocks which are indicated by a digit "1", for example, the block 56, delay the words applied thereto by a time interval which corresponds to the period during which exactly 32 words, including the associated validity bit (bits), arrive on the connection 42. Block element 58 is a parallel/series converter for presenting 24 words received in the correct sequence (so inverted with respect to the series/parallel conversion between the input 30 and the connection 40) on the output 60 to a user device which is not shown. 32 data bits (i.e. four data words) form exactly one audio sample signal for stereo reproduction. Should one of the four data words be invalid, either the entire audio signal or a mono-portion thereof may be declared invalid and be replaced by an interpolated signal which is derived from one or more neighboring audio signals. This is not elaborated in FIG. 3.

Figure 4:
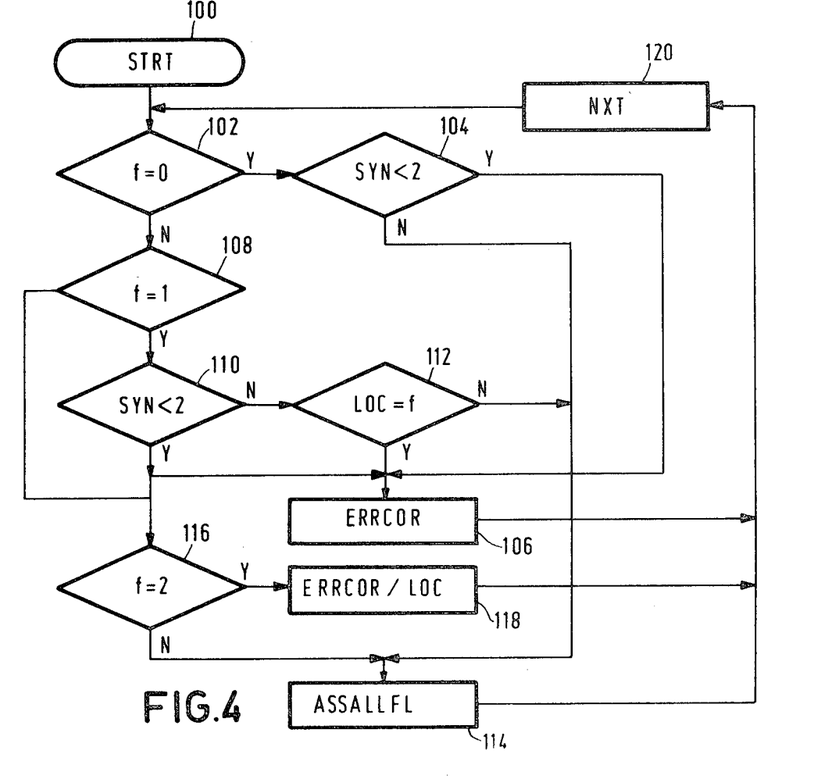
FIG. 4 shows a flow chart relating to the second error correction code.

FIG. 4 shows the processing of the data in the reproduction and correction element 50. The Figure is formed as a flow chart and concerns a preferred embodiment. When a group of 32 words has been received, the processing may commence (block 100). In block 102 it is detected whether the number of invalid code words amounts to zero. If yes (Y), the multiplication by the parity check matrix is performed in block 104 in order to determine the syndrome variable. The syndrome variable indicates whether the number of incorrect words amounts to 0, 1, 2 or more than two; if the number of incorrect words amounts to more than two, often a wrong number can be indicated. If the number indicated amounts to 0 to 1, the system proceeds to the block 106 in which the single incorrect word is connected or a dummy correction is performed in a conventional manner. If the number of invalid code words amounts to one, first block 108 is reached, via block 102, and subsequently block 110. The operation in block 110 is the same as that in block 104. If it is detected in block 110 that one word is incorrect, the system returns to the block 106 (the case of zero incorrect words cannot occur unless, as previously described, the redundancy in the channel word has been used to correct a 1-bit error in a channel word) and the real or dummy correction is performed. If it is detected in the block 110 that there were two incorrect words, it is detected in block 112 whether one of the two error locators indicates the (one) invalid word. If this is so (Y), the system proceeds to the block 106 in order to perform the correction. If the invalid word is not indicated, correction is not possible and the system proceeds to block 114; this also takes placed in the case of a negative (N) test result in the block 104. In the block 114, the validity bits of all words of the relevant group of words are set to "invalid". In block 112 a test for the detection of more than two incorrect words can be implicity incorporated; this result again leads to the block 114. If the number of invalid words amounts to three or more, the system proceeds to the block 114 via the blocks 102, 108, 116 in order to declare all words of the group generally invalid. If the number of invalid words amounts to exactly two, the relevant bits are used as error locators: using these error locators, the correction is performed in block 118. The syndrome may indicate that more than two words are incorrect, so that correction is not possible, in that case the system may proceed to the block 114 as yet, but this move is not separately shown. The outputs of the blocks 106, 114 and 118 lead to block 120. This block indicates that the next group of 32 code words must be loaded, because the error correction and reproduction of the 28 output words has been completed. The block 120 also comprises a "stop" output (not separately shown) for the case where no further words are received.

The formation of the syndrome variables in the blocks 104, 110 can be performed in known manner by multiplication of the 32 code words by the previously described parity check matrix (H). The correction is now possible because the syndrome consists of four syndrome words. This result can be considered as four equations to be formed which produce four unknown variables when solved. These variables may be two error locators and two error vectors; two arbitrary words can thus be corrected. When a word is indicated as being invalid and this indication is accepted as an error locator variable, one additional (linear) equation is formed as if it were, so that also more unknown could be solved (including the locator which is given by the invalidity bit).

The set-up of the block diagram of FIG. 4 may be modified. First of all, the case f=2 (block 116) can be treated in the same manner as the case f=1 (block 108). Secondly, the case f=3 or both cases f=3, 4 can be treated in the same way as the case shown in the block 116 in the Figure, so that the error locators are given by the invalidity bits. The case f≧5 must always be dealt with via the block 114.

It may also occur that a negative test result in the block 104 leads to the block 114, via error correction (like in the block 106), when the syndrome result indicates exactly two incorrect words. It is advantageous to set the invalidity bits of the corrected words to the state "valid" in the blocks 106, 118. Sometimes, (notably in the block 118), however, the invalidity bits will not be modified. It may also be that the test in the block 102 is omitted, so that the system proceeds directly from the block 100 to the block 104.

Figure 5:
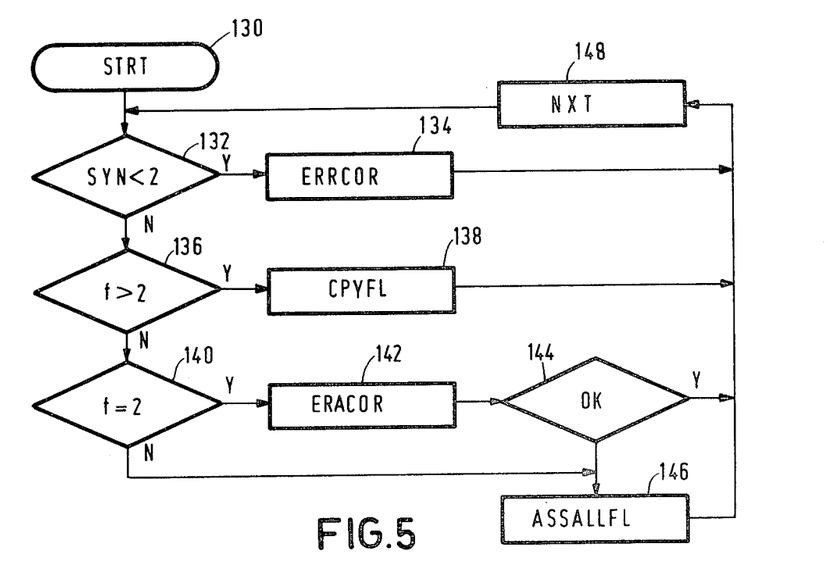
FIG. 5 shows a flow chart relating to the first error correction code.

FIG. 5 shows the processing of the data in the reproduction and correction element 54 of FIG. 3. This flow chart represents a preferred embodiment. When a group of 28 words has been received, the processing may commence (block 130). In block 132, the multiplication by the parity check matrix is performed in order to determine the syndrome variable and it is also detected whether this syndrome variable indicates that at the most one incorrect code word is present. In this test is affirmative (Y), the system proceeds to block 134 in which correction takes place, possibly a dummy correction. Any invalidity bit for the code word to be corrected in then set to the state "valid". When the syndrome variable indicates that more than one word is incorrect, it is tested in block 136 whether the number of invalidity bits is larger than two. If this is the case (Y), no correction can take place and the validity bits received are copied on the output code words of the element 54 of FIG. 3. When the number of invalidity bits is smaller than three, it is tested in block 140 whether this number equals two. If this is so, the error is corrected in block 142. The result is tested in block 144. The result is incorrect if one or more words comprising an invalidity bit which indicates such "true" invalidity (compare the description of FIG. 4) are not corrected. In the case of a "pro forma" validity bit, the correction at this level may also be a dummy correction. If two incorrect words are indicated by the syndrome variable, the correction can be "directly" performed. If it is detected in the block 140 that the number of invalidity bits equals 0 or 1, the system proceeds to the block 146. This also takes place if an "impossible" correction is detected in the block 144. In the block 146, an invalidity bit (1) is added to all words of the outgoing group of data words (24), so that it is indicated that an error must be concealed in another manner. The flow chart may be modified. For example, a second upper limit for the number of invalidity bits can also be detected in the block 136. If the number is larger than, for example, four, a fault on the entire system is indicated, and all words are indicated as being invalid. It is also possible to use the invalidity bits as error locators in a given range of values for the number of invalid code words as explained with reference to the block 118 of FIG. 4. However, this has been omitted in the Figure.

The outputs of the blocks 134, 138, 144, 146 in FIG. 5 are connected to the block 148 whose function, corresponds to that of the block 120 in FIG. 4.

Other embodiments are also feasible within the scope of the invention. For example, the relevant delay times may all be chosen to be a factor 4 larger in the encoder/decoder.

What is claimed is:

1. An error correction method for the transfer of word-wise data comprising the steps of:
    a. receiving a first number of data words in a first error encoder in order to add thereto a first series of parity words on the basis of a first generator matrix of a first word correction code;
    b. delaying said first numbers of data words and first series of parity words by delay times which are all different within each first number and associated first series in order to interleave said words so as to form as many second numbers of words;
    c. receiving said second number of words in a second error encoder in order to add thereto a second series of parity words on the basis of a second generator matrix of a second word correction code so as to form a third number of words;
    d. word-by-word modulation of said serially linked third numbers of words in order to form channel words which satisfy, by way of added redundancy, predetermined upper limits and lower limits for the admissible intervals between directly successive signal transitions, said channel words being pairwise separated by merging bits which also satisfy said upper limits and lower limits in conjunction therewith;
    e. demodulation of the channel words and merging bits after the transfer in order to reconstruct said third number of words (34);
    f. reproducing and, if possible and necessary, correcting said second numbers of words (50) on the basis of the second parity check matrix associated with the second generator matrix;
    g. de-interleaving (52) said second numbers of words, followed by the reproducing and, if possible and necessary, correcting of said first numbers of data words for a user (54) on the basis of the first parity check matrix associated with the first generator matrix; characterized in that
    h. during the demodulation a first flag bit is added to the word of said third number of words which is formed from an irrecognizable channel word, a second flag bit being added (114) to each word of the relevant second number of words during reproduction of a said second number of words on the basis of the second parity check matrix, under the control of an excessive number of first flag bits (116) within a said third number, in order to indicate the relevant second number of words as being generally unreliable.

2. An error correction method for the transfer of word-wise arranged data, comprising the following steps:
    a. receiving a first number of data words in a first error encoder in order to add thereto a first series of parity words on the basis of a first generator matrix of a first word correction code;
    b. delaying said first numbers of data words and first series of parity words by delay times which are all different within each first number and associated first series in order to interleave said words so as to form as many second numbers of words;
    c. receiving said second number of words in a second error encoder in order to add thereto a second series of parity words on the basis of a second generator matrix of a second systematic word correcting code so as to form a third number of words;
    d. word-by-word modulation of said serially linked third numbers of words in order to form channel words which satisfy, by way of added redundancy, predetermined upper limits and lower limits for the admissible intervals between directly successive signal transitions, said channel words being pairwise separated by merging bits which also satisfy said upper limits and lower limits in conjunction therewith;
    e. demodulation of the channel words and merging bits after the transfer in order to reconstruct said third number of words;
    f. reproducing and, if possible and necessary, correcting said second numbers of words on the basis of the second parity check matrix associated with the second generator matrix;
    g. de-interleaving said second number of words, followed by the reproducing and, if possible and necessary, correcting of said first numbers of data words for a user on the basis of the first parity check matrix associated with the first generator matrix; characterized in that
    h. during the demodulation a first flag bit is added to the word of said third number of words which is formed from an irrecognizable channel word, during the reproduction of said second number of words on the basis of the second parity check matrix, under the control of the absence of a correction to be made in a word and a first flag bit (112) indicating exactly that word, a second flag bit being added (114) to each word of the relevant second number of words in order to indicate said second number of words as being generally unreliable.

3. A method as claimed in claim 1 or 2, characterized in that during the reproduction of said first number of data words on the basis of the first parity check matrix under the control of an excessive further number of second flag bits within said second number a third flag bit (146) is added to the relevant first number of data words in order to indicate said first number of data words as being generally unreliable.

4. A method as claimed in claim 1 or 2 in which said first error correction code is a systematic code, characterized in that during the reproduction of a said first number of data words on the basis of the first parity check matrix under the control of the absence of a correction to be made in a word and a second flag bit which indicates exactly that word a third flag bit is added to each word of the relevant first number of data words in order to indicate said first number of data words as being generally unreliable.

5. A method as claimed in claim 1 or 2 in which said first error correction code is a systematic code, characterized in that during the reproduction of said first number of data words on the basis of the first parity check matrix use is made of a number of second flag bits which lies between predetermined limits in order to act as error locators for a correction to be performed.

6. A device for performing an error correction method for the transfer of word-wise arranged data as claimed in claims 1 or 2, characterized in that the first numbers of data words are formed by a sound pick-up system with analog-to-digital converter, the number of merging bits amounting to three and said upper limit and lower limit being 11 (eleven) and 3 (three) channel bits, respectively.

7. A device for the demodulation and decoding of data transferred by means of an error correction method as claimed in claims 1 or 2, characterized in that a non-correctable first number of data words is replaced by substitute data.

8. A decoder for use in a device as claimed in claim 7, characterized in that for the demodulation a group of synchronizing channel bits is ignored, a further group of control bits being ignored for the (possibly correcting) reproduction after demodulation.

9. A device as claimed in claim 1 or 2 in which said first error correction code is a systematic code, characterized in that during the reproduction of a said first number of data words on the basis of the first parity check matrix use is made of a number of second flag bits which lies between predetermines limits in order to act as error locators for a correction to be performed.

10. An error correction device for the transfer of word-wise data comprising:
   a. means for receiving a first number of data words in a first error encoder in order to add thereto a first series of parity words on the basis of a first generator matrix of a first word correction code;
   b. means for delaying said first numbers of data words and first series of parity words by delay times which are all different within each first number and associated first series in order to interleave said words so as to form as many second numbers of words;
   c. means for receiving a second number of words in a second error encoder in order to add thereto a second series of parity words on the basis of a second generator matrix of a second word correction code so as to form a third number of words;
   d. means for word-by-word modulation of said serially linked third numbers of words in order to form channel words which satisfy, by way of added redundancy, predetermined upper limits and lower limits for the admissible intervals between directly successive signal transitions, said channel words being pair-wise separated by merging bits which also satisfy said upper limits and lower limits in conjunction therewith;
   e. means for demodulation of the channel words and merging bits after the transfer in order to reconstruct said third number of words (34);
   f. means for reproducing and, if possible and necessary, correcting said second numbers of words (50) on the basis of the second parity check matrix associated with the second generator matrix;
   g. means for de-interleaving (52) said second numbers of words, followed by the reproducing and, if possible and necessary, correcting of said first number of data words for a user (54) on the basis of the first parity check matrix associated with the first generator matrix; characterized in that
   h. during the demodulation a first flag bit is added to the word of said third number of words which is formed from an irrecognizable channel word, a second flag bit being added (114) to each word of the relevant second number of words during reproduction of a said second number of words on the basis of the second parity check matrix, under the control of an excessive number of first flag bits (116) within a said third number, in order to indicate the relevant second number of words as being generally unreliable.

11. An error correction device for the transfer of word-wise arranged data comprising:
   a. means for receiving a first number of data words in a first error encoder in order to add thereto a first series of parity words on the basis of a first generator matrix of a first word correction code;
   b. means for delaying said first numbers of data words and first series of parity words by delay times which are all different within each first number and associated first series in order to interleave said words so as to form as many second numbers of words;
   c. means for receiving a second number of words in a second error encoder in order to add thereto a second series of a parity words on the basis of a second generator matrix of a second word correction code so as to form a third number of words;
   d. means for word-by-word modulation of said serially linked third numbers of words in order to form channel words which satisfy, by way of added redundancy, predetermined upper limits and lower limits for the admissible intervals between directly successive signal transitions, said channel words being pair-wise separated by merging bits which also satisfy said upper limits and lower limits in conjunction therewith;

e. means for demodulation of the channel words and merging bits after the transfer in order to reconstruct said third number of words;

f. means for reproducing and, if possible and necessary, correcting said second numbers of words on the basis of the second parity check matrix associated with the second generator matrix;

g. means for de-interleaving said second numbers of words, followed by the reproducing and, if possible and necessary, correcting of said first numbers of data words for a user on the basis of the first parity check matrix associated with the first generator matrix; characterized in that h. during the demodulation a first flag bit is added to the word of a said third number of words which is formed from an irrecognizable channel word, during the reproduction of a said second number of words on the basis of the second parity check matrix, under the control of the absence of a correction to be made in a word and a first flag bit (112) indicating exactly that word, a second flag bit being added (114) to each word of the relevant second number of words in order to indicate said second number of words as being generally unreliable.

12. A device as claimed in claim 10 or 11, characterized in that during the reproduction of a said first number of data words on the basis of the first parity check matrix under the control of an excessive further number of second flag bits within said second number a third flag bit (146) is added to the relevant first number of data words in order to indicate said first number of data words as being generally unreliable.

13. A device as claimed in claim 10 or 11 in which said first error correction code is a systematic code, characterized in that during the reproduction of a said first number of data words on the basis of the first parity check matrix under the control of the absence of a correction to be made in a word and a second flag bit which indicates exactly that word a third flag bit is added to each word of the relevant first number of data words in order to indicate said first number of data words as being generally unreliable.

14. A device for performing an error correction method for the transfer of word-wise arranged data as claimed in claims 10 or 11, characterized in that the first numbers of data words are formed by a sound pick-up system with analog-to-digital converter, the number of merging bits amounting to three and said upper limit and lower limit being 11 (eleven) and 3 (three) channel bits, respectively.

15. A device for the demodulation and decoding of data transferred by means of an error correction method as claimed in claims 10 or 11, characterized in that a non-correctable first number of data words is replaced by substitute data.

16. A decoder for use in a device as claimed in claim 15, characterized in that for the demodulation a group of synchronizing channel bits is ignored, a further group of control bits being ignored for the (possibly correcting) reproduction after demodulation.

* * * * *